United States Patent [19]
Hatanaka

[11] Patent Number: 4,745,364
[45] Date of Patent: May 17, 1988

[54] METHOD AND APPARATUS FOR RAPID NMR IMAGING

[75] Inventor: Masahiko Hatanaka, Otawara, Japan

[73] Assignee: Kabushiki Kaisha Toshiba, Kawasaki, Japan

[21] Appl. No.: 877,762

[22] Filed: Jun. 24, 1986

[30] Foreign Application Priority Data

Jul. 4, 1985 [JP] Japan .................................. 60-147770

[51] Int. Cl.$^4$ ............................................. G01R 33/20
[52] U.S. Cl. ..................................... 324/309; 324/312
[58] Field of Search ............... 324/307, 309, 312, 311, 324/314

[56] References Cited

U.S. PATENT DOCUMENTS

| | | | |
|---|---|---|---|
| 3,824,451 | 7/1974 | Freeman et al. | 324/312 |
| 3,999,118 | 12/1976 | Hoult | 324/314 |
| 4,070,611 | 1/1978 | Ernst | 324/309 |
| 4,611,172 | 9/1986 | Takase | 324/314 |

OTHER PUBLICATIONS

Nuclear Magnetic Resonance Imaging, C. L. Partain et al., pp. 453-471 1983.
Phys. in Medicine and Biology vol. 25, No. 4, Jul. 1980 pp. 75±-756.

Primary Examiner—Stewart J. Levy
Assistant Examiner—Louis M. Arana
Attorney, Agent, or Firm—Schwartz, Jeffery, Schwaab, Mack, Blumenthal & Evans

[57] ABSTRACT

A method and apparatus provides complete mensuration of two-dimensional Fourier components of a nuclear spin property thereby permitting undistorted image reconstruction. In spite of an unavoidable phase factor which originates from basic field inhomogeneities and drifts and from non-perfect electronics adjustment, an optimum sectional image is obtained from half measurements of the sampled resonance signals which are complex conjugate pairs. The image is obtained by determining the phase and then eliminating it from a spatial Fourier transform of the spin density distribution.

5 Claims, 5 Drawing Sheets

METHOD AND APPARATUS FOR RAPID NMR IMAGING

BACKGROUND OF THE INVENTION

This invention relates to an apparatus for performing two and/or three-dimensional nuclear magnetic resonance (NMR) imaging, which imaging is based upon a function of the spin density distribution, the spin-lattice relaxation time ($T_1$) and the spin-spin relaxation time ($T_2$) of particular protons within a target. More specifically, the invention relates to a NMR imaging method and apparatus which eliminates an additional unknown phase factor which originates from basic field inhomogeneities and field drifts and from non-perfect adjustment of electronic equipment.

Atomic nuclei have net magnetic moments when placed in a static magnetic field, $B_O$, at an NMR (Larmor) frequency $\omega$ given by the equation $$\omega = \gamma B_O$$

in which $\gamma$ is the gyro-magnetic ratio, constant for each NMR isotope. The frequency at which the nuclei precess is primarily dependent on the strength of the magnetic field $B_O$, and increases with increasing field strength.

Many different techniques are currently being investigated by which a characteristic image of a target, which might be part of a patient, can be effectively and efficiently obtained by nuclear magnetic resonance (NMR) imaging. Typically, the characteristic sought to be obtained is some function of the spin density distribution, the spin-lattice relaxation time ($T_1$) and the spin-spin relaxation time ($T_2$) of particular protons within the target. These protons are first excited by application of a magnetic field and a radio frequency (RF) pulse. Protons thus excited tend subsequently to relax, and during the process of relaxing generate a free induction decay (FID) signal. The above characteristic function of the relaxing protons within the target may be obtained by a Fourier transformation of this FID signal. By using the RF pulse chosen to have a selected frequency spectrum corresponding to the Larmor frequency of the protons given by the formula $\omega = \gamma B_O$, it is possible to excite protons in a single plane which may be a slice of the patient target.

Imaging techniques utilizing NMR may typically be classified as imaging from projections, and direct mapping.

The technique of imaging from projections (i.e., projection reconstructions) entails producing a multiplicity of projections from many different orientations by, for example, generating a linear field gradient within the object and recording a one dimensional projection of nuclear density in the direction defined by the gradient. An image is then reconstructed from the projections by mathematical techniques similar to those used X-ray tomography. Such a method is described, for example, by Lauterbur, Nature, 249-190, March 1973.

Direct mapping or Fourier imaging techniques generally employ an initial RF pulse to reorient the spins of the protons in the object by 90°. During the resultant FID signal, the object is subject to gradients applied consecutively in quick succession along the three principal Cartesian axes of the system. The FID and/or spin-echo signals are sampled, and a three dimensional Fourier transform is performed to develop a three dimensional image. Two dimensional Fourier transform methods are also known. In U.S. Pat. No. 4,070,611, incorporated herein by reference, there is described a method of producing images by the Fourier NMR technique. A general discussion of various projection and direct mapping techniques may be found in Chapter 35 of *Nuclear Magnetic Resonance NMR Imaging*, Partain et al, W. B. Saunders Company 1983, incorporated herein by reference.

The present invention is directed to a technique utilizing Fourier transformations with the production of images of samples. The spatial density distribution of these samples may be determined from the observed free induction decays (FID's) and/or spin echoes of the sample in the presence of static magnetic fields and switched magnetic field gradients.

The pulse sequence used to form an image by a Fourier-based NMR imaging method is shown in FIG. 1.

A single plane is first selected by application of a narrow band 90° RF pulse and field gradient $G_z$. Two-dimensional FID sets are then obtained by varying $t_x$ or the pulse length of $G_x$. The function of the gradient is to provide discrimination in the Y direction. It is introduced to give a known amount of twist or warp to each vertical column of spins (Y axis being vertical), and thus it phase encodes the signal prior to projection onto the X axis. Spin echoes are produced by application of 180° RF pulse. The $G_z$ pulse following application of the 180° pulse serves to refocus the spins oriented in the x,y plane. The entire set of steps described above is successively repeated a number of times, N, and in each repetition, a different amplitude of gradient $G_y$ is utilized to cover a range of vertical spatial frequencies from zero up to a maximum. The projected spin density values for any one column to be obtained from the Fourier transforms of the spin-echo signals are arranged in order of increasing $G_y$ pulse size, and subjected to another Fourier transform for representing the distribution of spin density up the column. When this is done for each column a complete two-dimensional image of the selected slice is obtained. The phase-encoding gradient $G_y$ causes N different projections to be collected onto the X axis, because spins at different heights are given varying amounts of phase twist by the presence of different values of $G_y$.

The phase information in an NMR signal is preserved by employing two phase-sensitive detectors in quadrature to produce two signals which are complex conjugate pairs.

The two signals obtained after quadrature-detection are written as follows after the Fourier transformation:

$$E(k_x, k_y) = \int \int f(x,y) \exp[i(k_x x + k_y y)] dx dy \quad (1)$$

in which $$k_x = \gamma G_x \cdot t$$

and $$k_y = \gamma \cdot n \cdot (G_y/N) \cdot t$$

The function f(x,y) gives the spatial distributions. The spatial frequencies $k_x$ and $k_y$ describe the wave numbers of the respective direction, x,y, and n an integral sampling index within the range $-NL$ or $LN$, N being an integer.

However, in practice, there is added to the above ideal signal an additional unknown phase factor which originates from basic field inhomogeneities and field drifts and from non-perfect electronics adjustment.

Therefore, Eq. (1) can be rewritten as $$E'(k_x,k_y) = \int\int f(x,y) \exp[i(k_x x + k_y y + \theta)] dx dy \quad (2)$$

The distribution of a nuclear resonance parameter as a function of the location (x,y) is given by $$f'(x,y) = f(x,y) \exp[i\theta] \quad (3)$$

Because one would have to take the real part of a complex two-dimensional Fourier-transformed signal, the "absorption", as an image value, and one would have to reject the imaginary component, the "dispersion", since the latter, on account of its broad wings, is not suitable for imaging, it is proposed that the distribution can be calculated by obtaining an absolute value of Eq. (3) as follows:

$$f(x,y) = |f'(x,y)| = |f(x,y)e^{i\theta}| \quad (4)$$

For these calculation steps, much time is consumed. Further the negative wings of the imaginary component are not useful for image information.

It is also noted in the case of use of the spin echo technique, there exist a point symmetry with respect to the point $k_x = k_y = 0$ of the $(k_x, k_y)$ space formed by the spatial frequencies as illustrated in FIG. 2. Thus, actually sampling operations are required, for example, either for all $k_x$, where $k_y \geq 0$, or for all $k_y$, where $k_x \geq \theta$. Such symmetry reduces the sampling period up to one half. Thus $$E(-k_x,-k_y) = [E(k_x,k_y)]^* \quad (5)$$

where "*" means a complex conjugate pair.

If the phase factor is considered in this method, Eq. (2) is defined as follows:

$$E(-k_x,-k_y) = \exp(-i\theta)[E(k_x,k_y)]^* \neq [E(k_x,k_y)]^* \quad (6)$$

As understood from the above expression, it is not expected that one may shorten the sampling period for all desired sampling data by utilization of the point symmetry in the $(k_x, k_y)$ space where the phase factor is taken into consideration.

SUMMARY OF THE INVENTION

The invention is directed to a method which substantially eliminates the phase factor as above described so as to enable utilization of the negative component of the detected signals in the inversion-recovery methods as image values, and to thus reduce the time required to form an image by up to one half.

To this end, a method in accordance with the invention is characterized in that a phase determination is made at an instant in time when the amount of phase encoding is zero a phase correction is applied which corrects the phase error using the determined phase signal at another time when the amount of phase encoding is not zero.

In accordance with the invention, by performing all of these corrections it is possible to detect the above-described phase factor, and eliminate it such that the two data channels which are quadrature-detected are in exact phase quadrature, the sampling period for imaging is shortened to about half, and, even though data acquisition is interrupted because of an external factor, an image may be formed from that obtained data.

BRIEF DESCRIPTION OF THE DRAWINGS

The invention will be described in detail hereinafter with reference to the embodiments shown in the drawings; therein.

DETAILED DESCRIPTION OF THE PREFERRED EMBODIMENT

Figure 3:
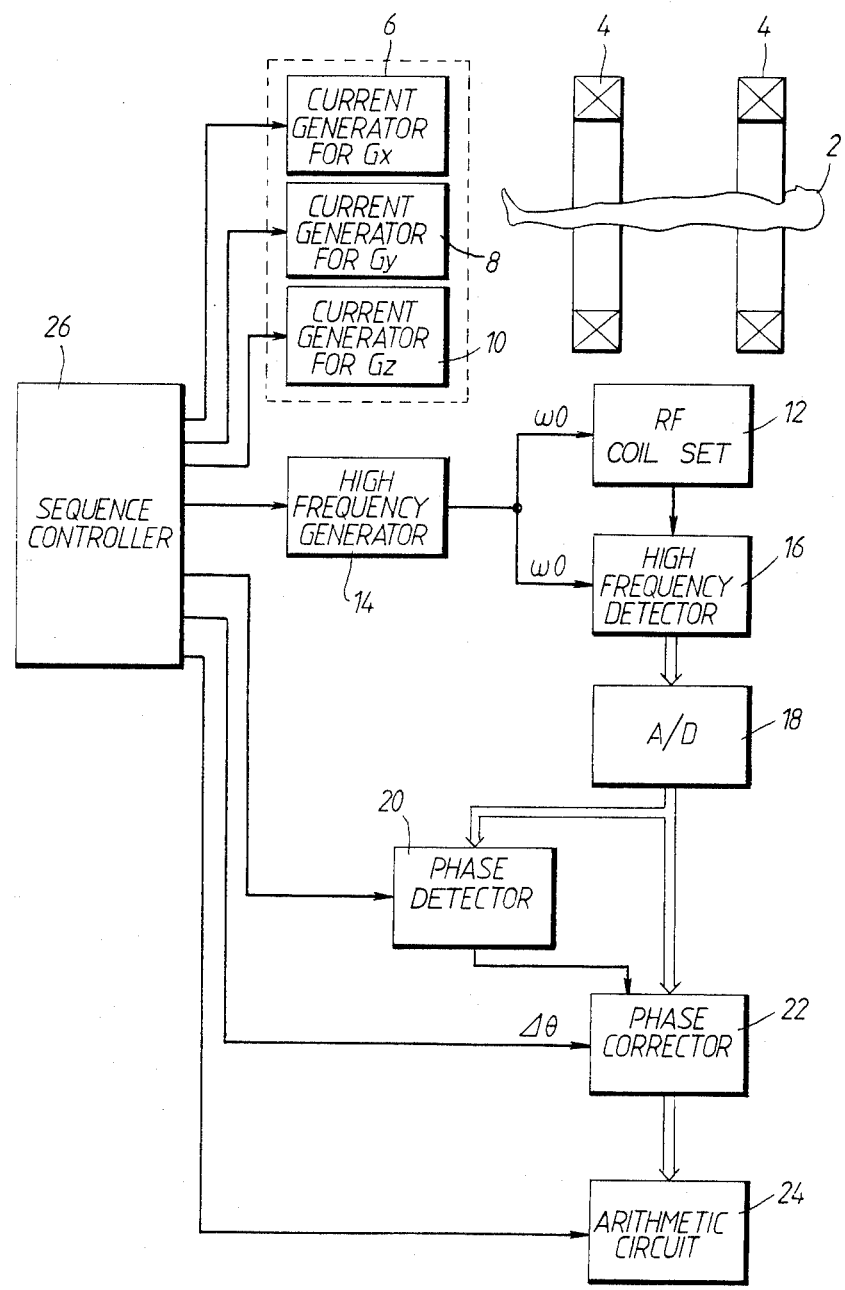
FIG. 3 shows the block circuit diagram of an apparatus for performing a method in accordance with the invention.

Referring to FIG. 3, a target or object 2 to be investigated is placed in a static magnetic field $B_O$ generated by a coil system 4 which is directed in the Z-direction.

Three current generators 6, 8 and 10 are electrically connected for excitation of respective coils (not shown) to produce field gradients $G_x$, $G_y$ and $G_z$. A coil set 12 is provided for generating and detecting a high-frequency electromagnetic field. A high-frequency signal generator 14 is connected for excitation of the coil set 12 which generates RF magnetic field pulses having the required modulation to excite resonance in a planar slice of the object defined by the application of the magnetic field gradient $G_z$ (i.e., the plane selection gradient) along the Z-direction produced by Z-axis gradient magnetic field generator 10. The coil set 12 as well as the gradient coils (not shown) are per se well known, and further details of same may be seen, for example, in U.S. Pat. No. 4,254,778, U.S. Pat. No. 4,422,042 and U.S. Pat. Nos. 4,509,011 incorporated herein by reference.

The coil set 12 serving the purpose of excitation as well as reception of the signal, is connected to an arithmetic circuit 24 for performing a Fourier transformation via a high-frequency signal detector 16, processing means such as an analog-to-digital convertor 18 phase detector 20, and phase corrector 22. Also for controlling the arrangement, additionally connections are provided between the high-frequency signal generator 14 and a central control means or sequence controller 26 whose functions and relationships will be described in detail hereinafter. Central control means or sequence controller 26 is connected to phase detector 20, phase corrector 22 and arithmetic circuit 24.

Figure 4:
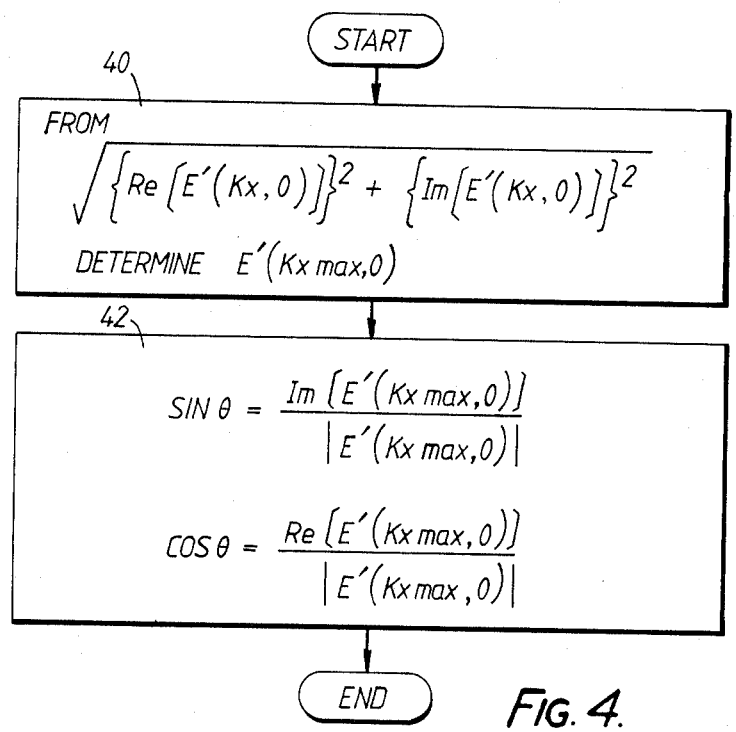
FIGS. 4 and 5 comprise a flow chart description of a suitable program for the improved phase corrector.

Before describing the method in accordance with the present invention for determining the nuclear magnetization distribution in the body 2, the principles of phase corrections will be explained in reference to FIGS. 4 and 5.

As described above, phase detection is achieved by obtaining a phase shift $\theta$ using the signals obtained after quadrature-detection (the amount of phase encoding being zero, i.e., $k_y=0$).

When $k_y$ is zero, the complex Fourier transform $E'(k_x,0)$ is obtained from Eq. (2).

$$E'(k_x,0) = \int\int f(x,y) \exp[i(k_x x + \theta)] dx dy \qquad (7)$$

From Eq. (7) the phase shift $\theta$ of the signal measured at the instant $t_0=0$; $k_x=0$ is given by $$\arctan \{Im[E'(0,0)]/Re[E'(0,0)]\} \qquad (8)$$

These two measured values $Re[E'(0,0)]$ and $Im[E'(0,0)]$ represent respectively a sinusoidal intensity modulation in the real and imaginary image (complex image wave).

To measure the spatial Fourier transform $E'(k_x,0)$ which is centered around $k_x=0$, it is necessary to find a maximum of the absolute value of the spatial Fourier transform $E'(k_x,0)$ at the instant $t_0=0$ (i.e., the value which exist when $t_O$, $k_x=0$).

The absolute value $|E'(k_x,0)|$ is derived from Eq. (7) as follows:

$$\begin{aligned}|E'(k_x,0)| &= |\int\int f(x,y)\exp(ik_x x)dxdy \exp(i\theta)| \\ &= |\int\int f(x,y)\exp(ik_x x)dxdy| \\ &= |E(k_x,0)|\end{aligned} \qquad (9)$$

Eq. (9) expresses that the absolute value of the spatial Fourier transformation $E(k_x,0)$ is not dependent on the phase shift $\theta$.

The sequence controller 26 may comprise a programmable microprocessor programmed to sequence the mathematical steps indicated herein by providing control signals to components connected thereto. The mathematical steps themselves may be implemented using logic arrays incorporated within phase detector 20 and phase corrector 22. Alternately, phase detector 20 and phase corrector 22 may be fabricated using microprocessors or their function may be performed by the central processor of the sequence controller. In response to an instruction from the operation, the program sequence for a given phase correction sequence is entered. FIG. 4 illustrates the function of the phase detector 20. As noted in FIG. 4, at step 40, the maximum value of the amplitude of the image wave is obtained, and then the spatial Fourier transformation $E'(k_x,0)$ is determined. Then, at step 42, the respective phase triangular relationships of $\sin \theta$, and $\cos \theta$ are calculated based upon the values of the real and imaginary image, and the maximum of the spatial Fourier transform $E'(k_x,0)$.

Next, phase correction will be explained, in relation to the program sequence illustrated in FIG. 5.

Following obtaining the phase shift $\theta$, the sequence controller 26 operates to eliminate the phase shift $\theta$ from the spatial Fourier transform $E'(k_x,k_y)$ given by Eq. (2). First, Eq. (2) is rewritten as follows:

$$\begin{aligned}E'(k_x, k_y) &= Re[E'(k_x, k_y)] + Im[E'(k_x, k_y)] \\ &= Fc(K_x, k_y)\cos\theta - Fs(k_x, k_y)\sin\theta + \\ &\quad i\{Fs(k_x, k_y)\sin\theta + Fc(k_x, k_y)\cos\theta\}\end{aligned} \qquad (10)$$

in which $$Fc(k_x,k_y) = \int\int f(k_x,k_y) \cos(k_x x + k_y y)dxdy \qquad (11)$$

and $$Fs(k_x,k_y) = \int\int f(k_x,k_y) \sin(k_x x + k_y y)dxdy \qquad (12)$$

In accordance with Eqs. (10), (11), and (12), the respective real and imaginary images are $$Fc(k_x,k_y) = Re[E'(k_x,k_y)] \cos\theta + Im[E'(k_x,k_y)] \sin\theta \qquad (13)$$

$$Fs(k_x,k_y) = -Re[E'(k_x,k_y)] \sin\theta + Im[E'(k_x,k_y)] \cos\theta \qquad (14)$$

Figure 5:
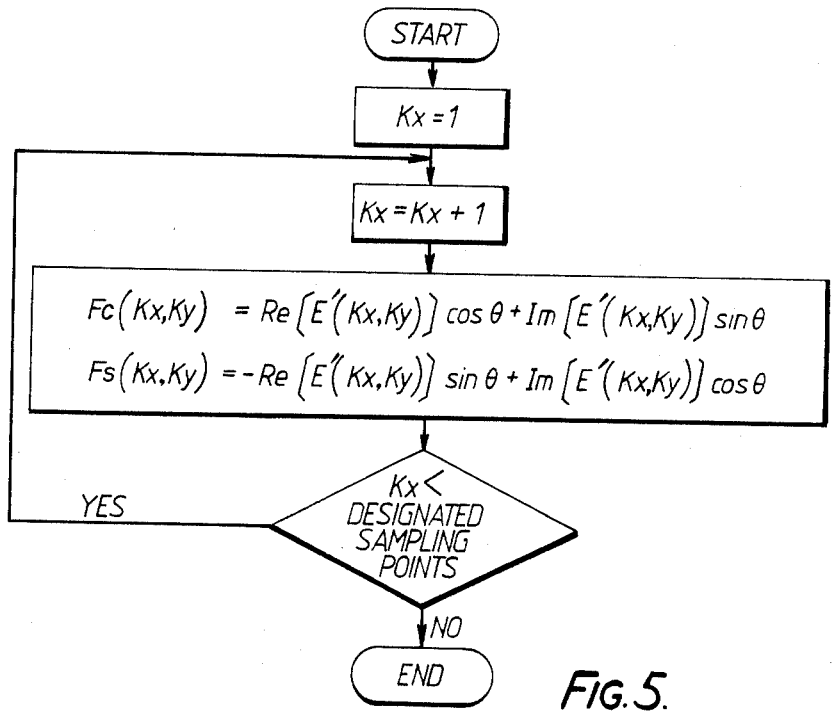

Consequently, as illustrated in FIG. 5, the processing of the samples for all $k_x$ (from negative to a maximum real value), where $k_y > 0$ is accomplished in accordance with Eqs. (13) and (14).

As has already been stated, the points thus measured have conjugate relationship with those for $k_y < 0$, thereby the desired points for forming the image are obtained with only half the number of different values of $k_y$ which are associated with a rectangular $k_x, k_y$ lattice. Consequently, the sampling period actually is reduced to about half by such a faster data collection method.

The method in accordance with the invention is not restricted to the half measurement of the rectangular $k_x, k_y$ lattice. The method also enables fast imaging formation from an incomplete data collection by substituting zero values in the remaining points to be measured as is per se known, e.g., U.S. Pat. No. 4,070,611.

Figure 1:
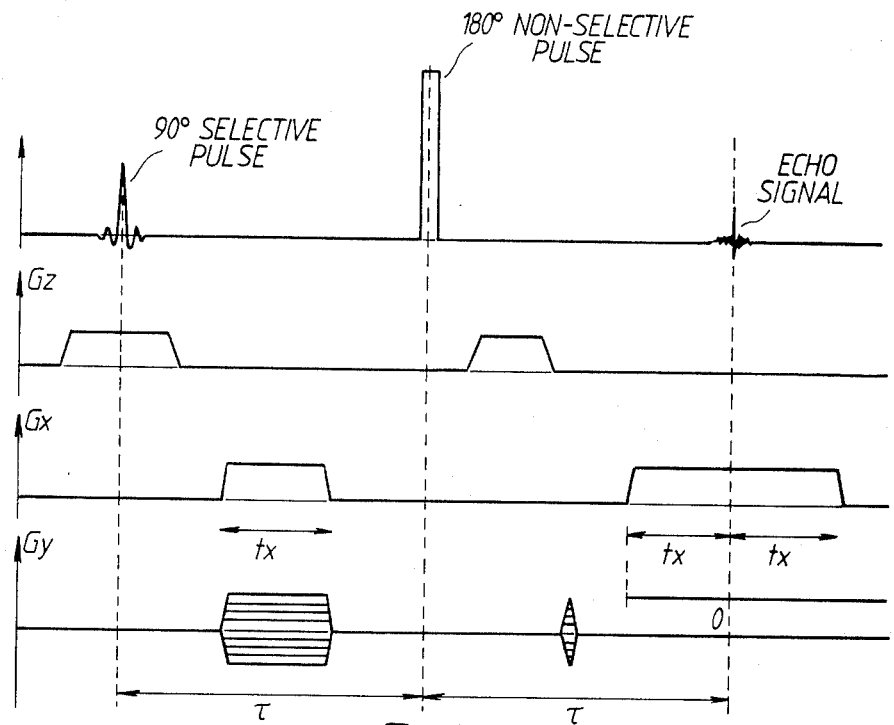
FIG. 1 shows a conventional pulse sequence in a Fourier transformation imaging technique.
Figure 2:
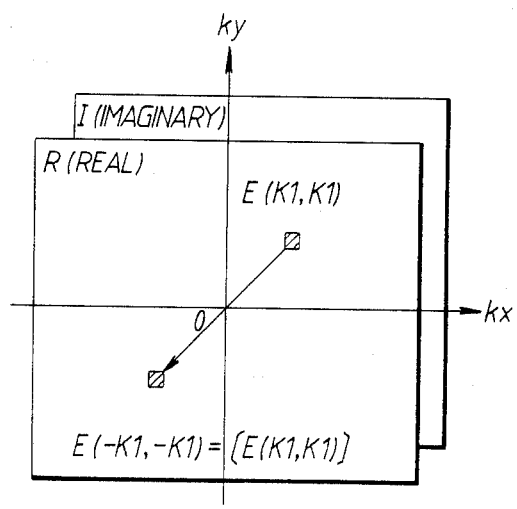
FIG. 2 shows a point symmetry of the signals before the double Fourier transformation in the domain of the spatial frequencies.
Figure 6:
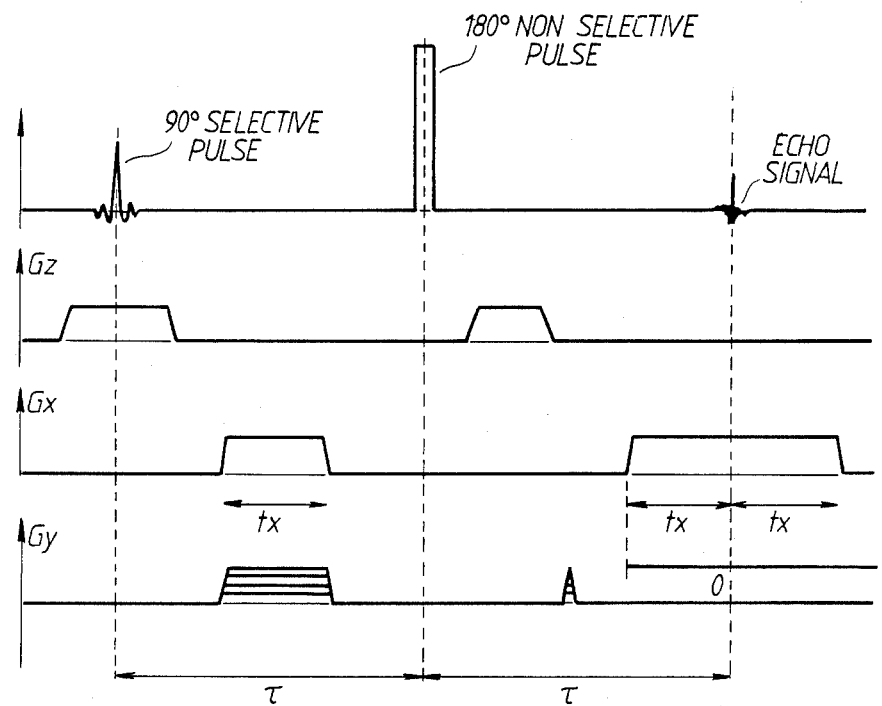
FIG. 6 depicts a pulse sequence used to obtain the measurement of the imaging data according to the present invention.

FIG. 6 depicts a pulse sequence used to obtain the measurement of the imaging data based upon the complex conjugate relationship, which is similar to FIG. 1, previously discussed, with the notable exception that in FIG. 6, the phase encoding gradient $G_y$ is not reversed. Because negative spatial frequencies $k_y$ are not required to be determined, no reversed gradient magnetic field $G_y$ is applied. Alternately, and again because of the noted conjugate relationship, the gradients $G_y$ could be applied for only negative values, omitting the positive values.

An embodiment of a method in accordance with the invention will be described with reference to the FIGS. 3 and 6–9. Using the high frequency coil set 12, a 90° pulse is generated after the activation of the coil system 4 which generate the stationary homogeneous magnetic field $B_O$. The gradient $G_x$ and $G_y$ produced by the current generators 6 and 8 are applied to determine the intensities of the spatial frequencies $(k_x,k_y)$ by measurement of the resonance signal after magnetization. After a period of time $\tau$ a 180° r.f. pulse is applied by the high frequency coil set 12 to use the so-called spin-echo technique to produce an echo resonance signal. After $G_y$ has been switched off, the echo signal is measured in the presence of $G_x$. The samples obtained are associated with the various $k_x$ values. It will be clear that a next sampling reference line on which measurements take place in the $k_y$ direction is determined by variation of the intensity of the gradient field $G_y$ or by variation of the period of time during which the gradient magnetic field $G_y$ is present or both.

The collected usable samples are quadrature-detected in the detector 16 in which the signal is mixed with a reference signal which generally has the same frequency $\omega_o$ as the angular frequency of the high-frequency electromagnetic field. After quadrature-detection, positive and negative frequencies can be distinguished. The analog, sampled signals are digitized in the convertor 18. The digital signals are provided to the phase detector 20 for determining the phase shift $\theta$ using the spatial Fourier transform information which is collected at which the spatial frequency $k_y$ is always zero. The result of the phase determination is transferred to the phase corrector 22 in which the phase shift determined in the phase detector 20 is eliminated from the measurement of all desired spatial frequencies as already explained.

Figure 7:
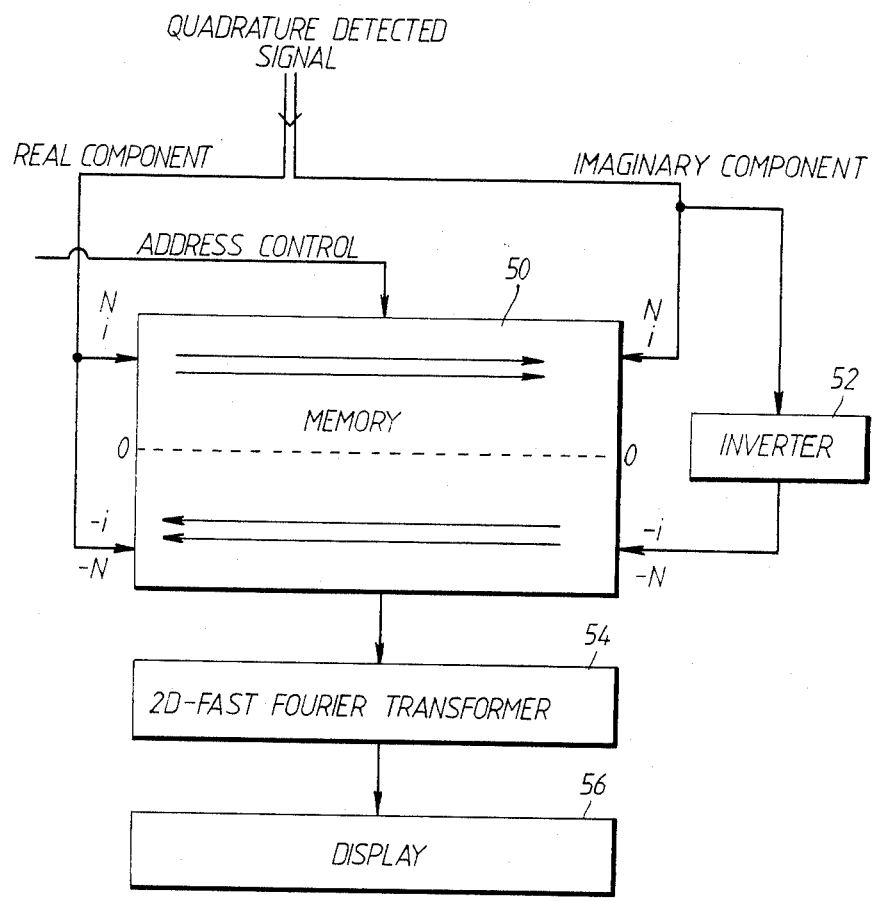
FIG. 7 depicts a block diagram showing a circuit configuration of the arithmetic circuit shown in FIG. 3.

The phase corrected information is stored in a memory incorporated in the arithmetic circuit 24. FIG. 7 depicts a block diagram showing a circuit configuration of the arithmetic circuit 24. In FIG. 7, the signals after quadrature-detection on the ith line in the $(k_x,k_y)$ space are stored in memory 50.

The two signals obtained after quadrature-detection are separately stored in the memory 50 in a manner such that the real signals in the ith line of the $(k_x,k_y)$ space are stored successively from left to right, and the imaginary signals are provided via an inversion circuit 52 to cause the imaginary signals to be inverted and stored in the −ith line from right to left. The central control means 26 controls the storing of the information in the memory 50 by an appropriate address control signal generated therefrom. After Fourier transformation in a Fourier transformer 54, it produces a spectrum whose amplitudes contain data concerning nuclear magnetization. The intensity of the precessional nuclear magnetization can be determined as a function of the frequency, and the spatial Fourier transform describes the spatial frequencies used to compose the image. On the basis of these frequencies a real and an imaginary image can be reconstructed, and displayed on a display 56.

Figure 8:
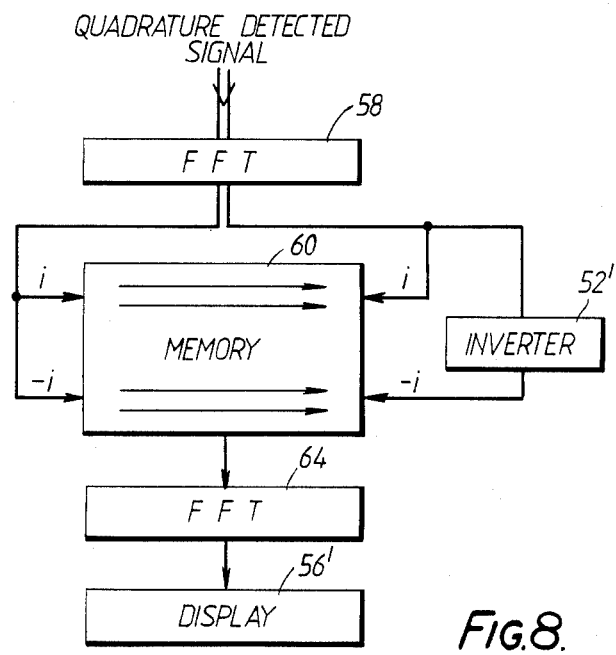
FIG. 8 depicts another embodiment of the circuit configuration of the arithmetic circuit.

In accordance with the proposed method, as shown in FIG. 7 the double Fourier transformation is performed on the two signals after quadrature-detection in the 2-D Fourier transformer 54. Another configuration of the arithmetic circuit 24 is shown in FIG. 8. After a 1-D Fourier transformation on the signals, in 1-D Fourier transformer 58, 1-D Fourier transformed signals are stored in a memory 60, via an inversion circuit 52' for storing real and imaginary components in a similar fashion as that shown in FIG. 7. By subsequently performing another 1-D Fourier transformation on the information read out of the memory 60 using 1-D Fourier transformer 64, the desired image wil be reconstructed, and then displayed on the display 56'.

In accordance with the modified method using one-dimensional Fourier transformation process two separate times, the order of the sampling points in the memory 60 does not change. Such an arrangement makes for a simple control for storing the data into the memory 60.

Even though the phase detector 20, phase corrector 22, the inversion circuits 52, and 52', the memories 50 and 60, and the further Fourier transformers 54, 58, 64 have been described on the basis of discrete components, the same result can very well be obtained by utilizing a microprocessor which may be the same or different from that of the central control means 26. The memory means can be substituted by a magnetic disc memory system, and the 2-D Fourier transformation may be performed by using 1-D Fourier transformation two times.

What is claimed is:

1. A method of determining a spatial nuclear magnetization distribution in an object, said method comprising the steps of:
    (a) applying a static magnetic field along an axis of the object to be sampled;
    (b) exciting, with a frequency selective RF pulse, selected nuclear spins in a selected plane of said object in the presence of a plane selection gradient of the static magnetic field, so as to produce an NMR signal;
    (c) applying simultaneously, first and second mutually orthogonal magnetic field gradients at least one of said mutually orthogonal gradients having one of a predetermined number of selectable different magnitudes to phase encode into said NMR signal, information of the spatial distribution of said excited nuclear spins within a volume containing said selected plane;
    (d) irradiating said object with a 180° RF pulse so as to invert said excited nuclear spins to obtain NMR spin echo signals, said nuclear spin echo signals producing a composite NMR signal for Fourier transformation to yield information of said spatial distribution throughout said selected plane of said object;
    (e) determining an inherent phase shift of said spatial distribution information Fourier-transformed on said composite NMR signal with respect to a spatial Fourier-transformed information of a measured NMR signal at a point where one of said first and second mutually orthogonal gradients does not contribute substantially to said excited nuclear spins, and
    (f) utilizing said determined phase shift for calculating said nuclear magnetization distribution.

2. A method as recited in claim 1, wherein the step of determining said phase shift comprises the steps of:
    (a) determining a maximum value of amplitude $$E'(k_{x\ max},0) = \{Re[E'(k_x,0)]\}^2 + \{Im[E'(k_x,0)]\}^2$$

(b) and determining the phase shift based on one or both of the phase relationships $$\sin\theta = \frac{Im[E'(k_{x\ max},\ 0)]}{|E'(k_{x\ max},\ 0)|}$$

$$\cos\theta = \frac{Re[E'(k_{x\ max},\ 0)]}{|E'(k_{x\ max},\ 0)|}$$

where $E'$ is the Fourier transform of the spatial distribution of the selected nuclear spins.

3. A method as recited in claim 2, wherein said utilizing step includes the step of calculating real and imaginary images utilizing said determined phase shift and varying wave numbers $k_x,k_y$ such that one of the following conditions takes place:
    (a) $k_y \geq 0$ while $k_x$ varies over designated sampling points;
    (b) $k_y \leq 0$ while $k_x$ varies over designated sampling points.

4. A method as recited in claim 3, wherein said calculating step includes calculating the relationships $$F_c(k_x,k_y) = Re[E'(k_x,k_y)]\cos\theta + Im[E'(k_x,k_y)]\sin\theta$$

$$F_s(k_x,k_y) = -Re[E'(k_x,k_y)]\sin\theta + Im[E'(k_x,k_y)]\cos\theta.$$

5. An apparatus for rapidly determining the nuclear magnetization distribution in a part of an object, comprising:
  (a) means for generating a stationary homogeneous magnetic field;
  (b) means for generating high-frequency electromagnetic radiation whose magnetic field direction is directed perpendicularly to the field direction of the homogeneous magnetic field to thereby provide an NMR signal;
  (c) means for applying first and second mutually orthogonal magnetic field gradients each having one of a predetermined number of selectable magnitudes to phase encode into NMR signal;
  (d) means for applying a non-selective 180° RF pulse to said object to produce a spin-echo signal from said NMR signal;
  (e) sampling means for sampling said spin-echo signal; and
  (f) correction means for obtaining a phase shift of said sampled signals with reference to a predetermined spatial frequency determined by Fourier transformation of a measured NMR signal at a point where one of said first and second mutually orthogonal gradients does not contribute substantially to said excited nuclear spins, and eliminating said phase shift from the spatial Fourier transformed signals using said obtained phase shift value.

* * * * *